United States Patent
Cheng et al.

(10) Patent No.: US 6,383,883 B1
(45) Date of Patent: May 7, 2002

(54) METHOD OF REDUCING JUNCTION CAPACITANCE OF SOURCE/DRAIN REGION

(75) Inventors: Yao-Chin Cheng, Chi-Lung; Kuan-Cheng Su, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/173,831

(22) Filed: Oct. 16, 1998

(30) Foreign Application Priority Data

Aug. 7, 1998 (TW) .......................................... 87113022

(51) Int. Cl.7 ............................................... H01L 21/00
(52) U.S. Cl. ........................ 438/305; 438/301; 438/307
(58) Field of Search ................................. 438/301, 303, 438/305, 306, 299, 307

(56) References Cited

U.S. PATENT DOCUMENTS 5,648,286 A * 7/1997 Gardner et al. ............... 437/44
5,753,556 A * 5/1998 Katada et al. ............... 438/302
6,004,849 A * 12/1999 Gardner et al. ............. 438/286
6,107,149 A * 9/2000 Wu et al. .................... 438/303

* cited by examiner

*Primary Examiner*—Richard Elms
*Assistant Examiner*—Bradley Smith

(57) ABSTRACT

A method of reducing junction capacitance of a source/drain region. A gate oxide layer is formed on a first conductive type substrate. A polysilicon layer is formed and patterned on the gate. Light second conductive type ions are implanted into the substrate with the polysilicon layer as a mask. An insulation layer is formed to cover a side wall of the polysilicon layer. A first step heavy of ion implantation with second conductive type ions is perform to the substrate using the polysilicon layer and the spacer as mask, so that a heavily doped region is formed. A second step of heavy ion implantation with the second conductive type ions is performed to the substrate using the polysilicon layer and the spacer as masks, so that the heavily doped region is broadened and deepened with a smooth ion distribution profile.

20 Claims, 2 Drawing Sheets

METHOD OF REDUCING JUNCTION CAPACITANCE OF SOURCE/DRAIN REGION

CROSS-REFERENCE TO RELATED APPLICATION

This application claims the priority benefit of Taiwan application serial no. 87113022, filed Aug. 7, 1998, the full disclosure of which is incorporated herein by reference.

BACKGROUND OF THE INVENTION

1. Field of the Invention

The invention relates in general to a method of reducing junction capacitance of a source/drain region, and more particularly, to a method of using double implantation to reduce junction capacitance of a source/drain region.

2. Description of the Related Art

As the dimension of a metal-oxide semiconductor (MOS) device shrinks, the operation speed of the transistor becomes faster due to the shortened channel length. However, as the channel is shortened toward a certain limit, a hot electron effect is induced to a cause malfunction or operation failure. The structure of a lightly doped drain (LDD) has been widely used to solve the short channel effect.

FIG. 1A to FIG. 1C are schematic cross sectional views showing a method of forming a source/drain region. In FIG. 1A, using thermal oxidation, a gate oxide layer 20 is formed on a substrate 10. A polysilicon layer and a tungsten silicide layer are formed on the gate oxide layer 20. Using photolithography and etching process, a gate 12 is defined. In FIG. 1B, a lightly doping process is performed to form a light doped drain structure. Arsenic ions 30 are implanted into the substrate with the gate 12 as a mask. The substrate 10 is disposed into a furnace for annealing, so that the surface atomic structure which has been damaged during ion implantation is rearranged. A lightly doped drain region 16 is thus formed. In FIG. 1C, a silicon oxide layer is formed to cover the substrate 10 and the gate 12. A part of the silicon oxide layer is removed by etch back to form a spacer on a side wall 14 of the gate 12. Using the gate 12 and the spacer 14 as masks, a heavily doped region 18, that is, a source/drain region is formed by implanting arsenic ions 30' with a higher concentration into the substrate 10 deeper than the LDD region 16.

A depletion region is formed at the interface between the source/drain region and the substrate due to the different potentials. The depletion region is electrically neutral. Therefore, the depletion region is equivalent to a dielectric layer between the electrodes (source/drain region) and the substrate. As a consequence, a junction capacitance is induced. The junction capacitance is closely related to the width of the depletion region, and the width of the depletion region depends on the concentration gradient of the implanted ions in the substrate. The distribution profile of implanted ions formed by the above conventional method is relatively abrupt to form a steep depletion region, therefore, a larger junction capacitance is caused to deteriorate the device operation.

SUMMARY OF THE INVENTION

It is an object of the invention to provide a method of forming a method of reducing the junction capacitance of a source/drain region. In addition to implanting arsenic ions to form the source/drain region, another step of implanting phosphorus ions into the source/drain region is performed. The arsenic ions distribution gradient is thus declined. Consequently, the junction capacitance is reduced, and the operation speed of device is enhanced.

To achieve the above-mentioned objects and advantages, a method of reducing junction capacitance is provided. A gate oxide layer is formed on a substrate. A polysilicon layer and a tungsten slicide layer are formed on the gate oxide layer. Using photolithography and etching process, a gate is defined. Using the gate as a mask, a lightly doped drain region is formed by implanting arsenic ions with a light concentration into the substrate. A thermal process is performed for arsenic ions diffusion. An insulation layer is formed to cover the substrate and the gate. Using dry etching to remove a part of the insulation, a spacer is formed on a side wall of the gate. Using the gate and the spacer as masks, arsenic ions with higher concentration is implanted deeper into the substrate. A thermal process is performed for arsenic ion diffusion. Another arsenic ion implantation is further performed to form a source/drain region.

Both the foregoing general description and the following detailed description are exemplary and explanatory only and are not restrictive of the invention, as claimed.

DESCRIPTION OF THE PREFERRED EMBODIMENTS

In FIG. 2A to FIG. 2D, a method of forming a source/drain region in a MOS device is shown. In this embodiment, the method of forming an NMOS is described. That is, a P-type substrate is provided and an N-type source/drain region is formed in the P-type substrate. It is appreciated that people skilled in the art can apply this technique in forming a PMOS in an N-type semiconductor substrate.

Figure 1A:
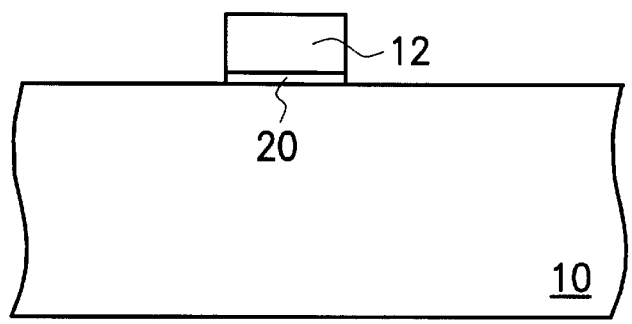
FIG. 1A to FIG. 1C shows a conventional method of forming a source/drain region; and FIG. 2A to FIG. 2D shows a method of forming a source/drain region in a preferred embodiment according to the invention.
Figure 1B:
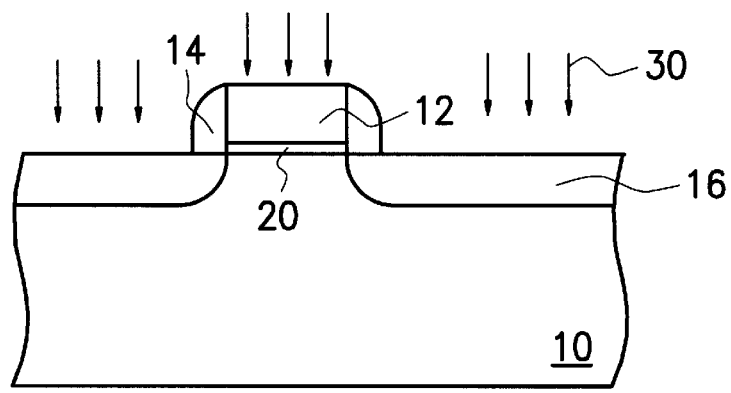
Figure 1C:
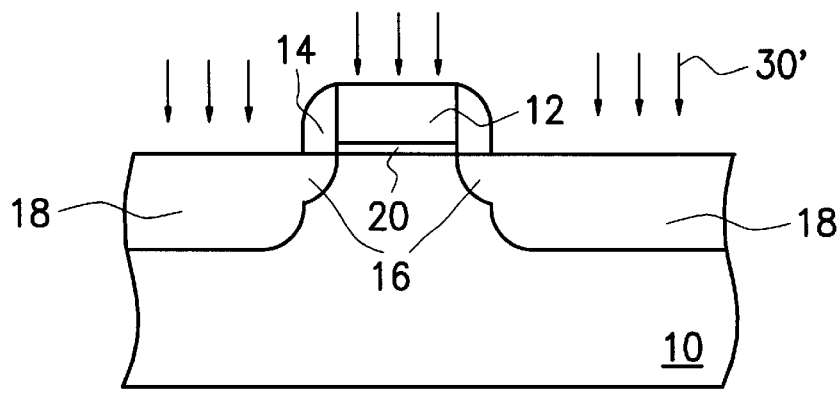
Figure 2A:
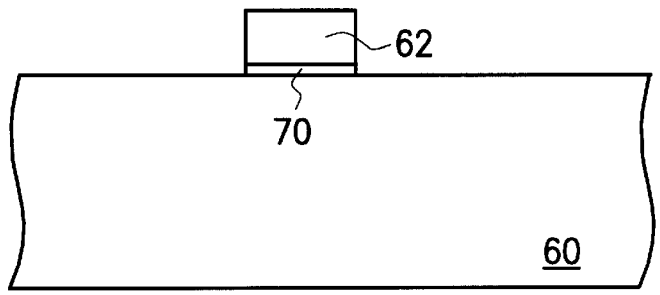

In FIG. 2A, a gate oxide 70 is formed on a P-type substrate 60. Preferably, thermal oxidation is used to form the gate oxide layer, though other method may also be used. A polysilicon layer is formed, for example, by chemical vapor deposition (CVD) on the gate oxide layer. Typically, to enhance the conductivity and physical characteristic such as the adhesion of a gate formed of the polysilicon layer in the following process, a metal silicide layer, for example, a tungsten silicide layer is formed on the polysilicon layer. Using photolithography and etching, a gate 62 is formed by patterning the metal silicide layer and the polysilicon layer.

Figure 2B:
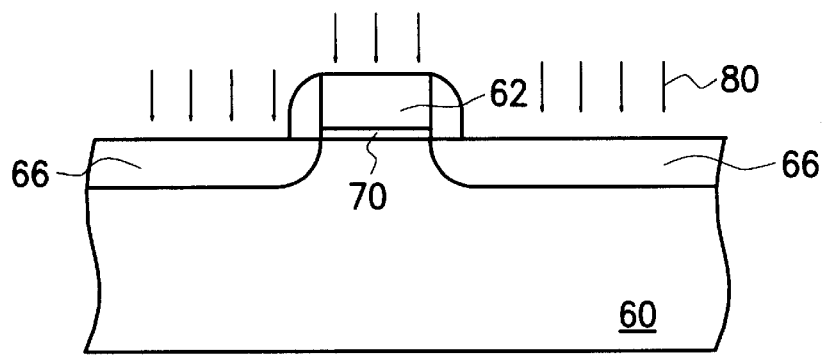

In FIG. 2B, using the gate as a mask, N-type ions 80, for example, arsenic ions are implanted into the substrate 60. After a thermal process, for example, a rapid thermal annealing process (RTA), the implanted ions are diffused into the substrate 60 to form a lightly doped drain region 66.

Figure 2C:
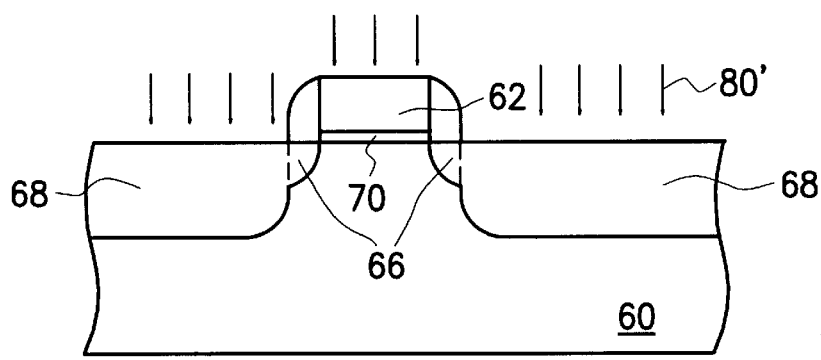

In FIG. 2C, an insulation layer, for example, a silicon oxide layer formed by low pressure chemical vapor deposition (LPCVD), is formed to cover the substrate 60 and the gate 62. Using anisotropic etch such as a dry etch process, a part of the insulation layer is removed to form a spacer 66 on a side wall of the gate 62. Using the gate 62 and the spacer 64 as masks, the substrate 60 is further doped by N-type ions 80', for example, arsenic ions, with a heavier concentration than the implanted ions 80 for forming the lightly doped drain region 66 shown as FIG. 2B. A thermal process, preferably, a rapid thermal annealing process is performed, so that the implanted ions 80' is diffused to form a heavily doped region 68.

Figure 2D:
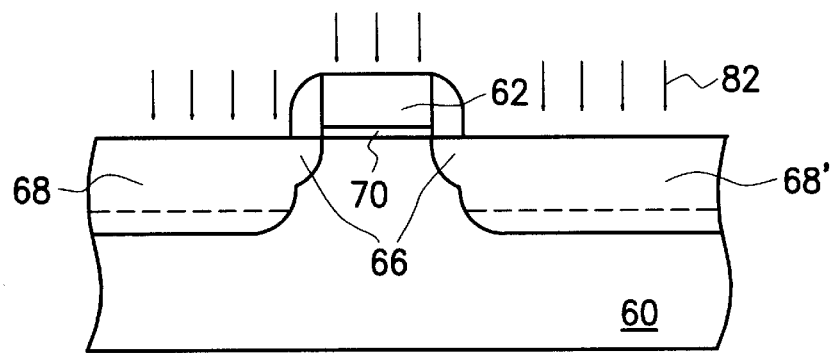

In FIG. 2D, using the gate 62 and the spacer 64 as masks, an additional ion implantation is performed. N-type ions 82, for example, phosphorus (P) with a concentration of about $10^{12}$ to $10^{13}$/cm$^2$, are implanted with an doping energy of about 40 to 100KeV into the substrate 60. Through a thermal process, for example, a rapid thermal annealing process, the implanted ions 82 are diffused, so that the heavily doped region 68 are deepened and expanded as a source/drain region 68' with a declined gradient of the distribution profile.

In the invention, the distribution profile of implanted ion concentration is declined, so that the junction width is increased. From Table 1, a simulated experiment data for a logic NMOS of 0.25 μm is presented. In the table, the first column shows the junction capacitance $C_j$, the threshold voltage $V_T$, saturated drain current $I_{dsat}$, the cut off current $I_{off}$ and the drain-induced barrier lowering (DIBL) of the implanted arsenic ions. Whereas, the second column shows the junction capacitance $C_j$, the threshold voltage $V_T$, saturated drain current $I_{dsat}$, the cut off current $I_{off}$ and the drain-induced barrier lowering (DIBL) of the implanted arsenic and phosphine ions.

TABLE 1

| | As source/drain implant | As + P source/drain implant |
|---|---|---|
| $C_J$(fF/μm2) | 1.27 | 1.08 |
| $V_T$(V) | 0.439 | 0.44 |
| $I_{dsat}$(mA) | 6.29 | 6.32 |
| $I_{Off}$(pA) | 65 | 70 |
| DIBL(mV) | 50 | 56 |

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of reducing junction capacitance of a source/drain region, comprising:

forming a gate oxide layer on a first conductive type substrate;

forming a polysilicon layer on the gate oxide layer;

patterning the polysilicon layer and the gate oxide layer to form a gate;

lightly implanting ions having a second conductive type into the substrate using the polysilicon layer as a mask;

forming an insulation spacer on a side wall of the polysilicon layer;

performing a first step of heavy ion implantation with ions having the second conductive type to the substrate using the polysilicon layer and the insulation spacer as masks, so that a heavily doped region is formed; and performing a second step of heavy ion implantation with ions having the second conductive type to the substrate using the polysilicon layer and the insulation spacer as masks, so that an additional heavily doped region is formed at a bottom portion of the heavily doped region so as to smooth an ion distribution profile from the heavily doped region to the substrate.

2. The method according to claim 1, further comprising forming a metal silicide layer on the polysilicon layer.

3. The method according to claim 1, wherein the step of lightly implanting ions comprising doping the ions having the second conductive type with a concentration less than the steps of performing the first step and the second step of heavy ion implantation.

4. The method according to claim 1, wherein the first conductive type includes P-type and the second conductive type includes N-type.

5. The method according to claim 4, wherein the ions having the second conductive type in the first step of heavy ion implantation includes arsenic ions.

6. The method according to claim 4, wherein the ions having the second conductive type in the second step of heavy ion implantation includes phosphorus ions.

7. The method according to claim 4, wherein the second step of heavy ion implantation comprises doping the ions with a concentration of about $10^{12}$ to $10^{13}$ ions/cm$^2$ at an energy of about 40 KeV to 100 KeV.

8. The method according to claim 1, wherein the first conductive type includes N-type and the second conductive type includes P-type.

9. The method according to claim 1, further comprising performing a thermal process to diffuse the ions from the step of lightly implanting.

10. The method according to claim 9, wherein the thermal process includes a rapid thermal annealing process.

11. The method according to claim 1, further comprising performing a thermal process to diffuse the ions from the first step of heavy ion implantation.

12. The method according to claim 11, wherein the thermal process includes a rapid thermal annealing process.

13. The method according to claim 1, further comprising performing a thermal process to diffuse the implanted ions.

14. The method according to claim 13, wherein the thermal process includes a rapid thermal annealing process.

15. A method of forming a metal-oxide semiconductor device, comprising:

forming a gate on a substrate;

forming a lightly doped drain region in the substrate using the gate as a mask;

forming a spacer on a side wall of the gate;

forming a first heavily doped region in the substrate using the gate and the spacer as masks; and forming a second heavily doped region in the substrate at a bottom portion of the first heavily doped region, wherein the second heavily doped region has a doping concentration to form a declined ion concentration gradient from the first heavily doped region to the substrate.

16. The method according to claim 15, wherein a depth of the first heavily doped region is increased by the second heavily doped region.

17. The method according to claim 15, wherein the second heavily doped region is doped with ions having a concentration of about $10^{12}$ to $10^{13}$ ions/cm$^2$ at an energy of about 4 KeV to 100 KeV.

18. The method according to claim 15, wherein the lightly doped drain region has a depth shallower than the first heavily doped region.

19. The method according to claim 15, wherein the lightly doped region, the first heavily doped region and the second heavily doped region serve together as a source/drain region of the metal-oxide semiconductor device.

20. A method of reducing junction capacitance, comprising:

forming a gate comprising at least a gate oxide and a polysilicon layer on a first conductive substrate;

forming a first doped region in the substrate with the gate as a mask;

forming a second doped region with a concentration heavier and a depth deeper than the first doped region; and further doping the second doped region to obtain a declined junction profile between the substrate and the second doped region, so that a junction capacitance therebetween is reduced.

* * * * *